United States Patent [19]
Grutzediek et al.

[11] Patent Number: 5,571,731
[45] Date of Patent: Nov. 5, 1996

[54] PROCEDURE FOR THE MANUFACTURE OF BIPOLAR TRANSISTORS WITHOUT EPITAXY AND WITH FULLY IMPLANTED BASE AND COLLECTOR REGIONS WHICH ARE SELF-POSITIONING RELATIVE TO EACH OTHER

[75] Inventors: Hartmut Grützediek; Joachim Scheerer, both of Mainz; Wolfgang Winkler, Frankfurt/Oder; Michel Pierschel, Berlin; Karl-Ernst Ehwald, Frankfurt/Oder, all of Germany

[73] Assignee: PREMA Präzisionselektronik GmbH, Mainz, Germany

[21] Appl. No.: 215,187

[22] Filed: Mar. 21, 1994

[30] Foreign Application Priority Data

Mar. 21, 1993 [DE] Germany .............. 43 08 958.5

[51] Int. Cl.⁶ .................. H01L 21/265; H01L 21/00; H01L 21/30; H01R 21/22
[52] U.S. Cl. ................. 437/31; 437/36; 437/80; 437/147; 437/931
[58] Field of Search .................. 437/31, 32, 33, 437/70, 36, 72, 80, 147, 931; 148/DIG. 9, DIG. 10

[56] References Cited

U.S. PATENT DOCUMENTS

| | | | |
|---|---|---|---|
| 4,368,573 | 1/1983 | deBrebisson et al. | 437/70 |
| 4,412,378 | 11/1983 | Shinada | 437/80 |
| 4,531,282 | 7/1985 | Sakai et al. | 437/31 |
| 4,545,114 | 10/1985 | Ito et al. | 437/31 |
| 4,669,180 | 6/1987 | Thomas et al. | 437/31 |
| 5,100,811 | 3/1992 | Winneri et al. | 437/31 |
| 5,183,768 | 2/1993 | Kameyama et al. | 437/31 |
| 5,286,660 | 2/1994 | Chiou et al. | 437/70 |
| 5,328,859 | 7/1994 | Vo et al. | 437/31 |
| 5,411,900 | 5/1995 | Nagel | 437/31 |

*Primary Examiner*—Mary Wilczewski
*Assistant Examiner*—Brian K. Dutton
*Attorney, Agent, or Firm*—Frishauf, Holtz, Goodman, Langer & Chick, P.C.

[57] ABSTRACT

A method of fabricating a semiconductor device. A series of layers is deposited on a semiconductor substrate of a first conductivity type to form a shielding arrangement, including an upper part and a lower part, to provide a shield against accelerated ions. This is followed by forming openings in the shielding arrangement by microlithographic processes and anisotropic etching, and then implanting ions via the openings to form one of a base area and a base-connection area of the first conductivity type. Edges of the openings are displaced by isotropic etching of the lower part of the shielding arrangement. Ions are implanted which have been accelerated to energies sufficient to penetrate the one of the base area and base-connection area and a portion of the substrate underlying the one of the base area and base-connection area to form a sub-collector and a graded collector of a second conductivity type for completely encircling and separating a base from the substrate, wherein the sub-collector is more heavily doped than the collector. The base is formed by one of (i) implanting ions between the step of forming openings and the step of implanting ions accelerated, and (ii) implanting ions after the step of implanting ions accelerated. The method further includes forming an emitter, depositing an insulating layer, forming contacts to the base, the emitter and the collector, and forming a metalization arrangement.

18 Claims, 8 Drawing Sheets

PROCEDURE FOR THE MANUFACTURE OF BIPOLAR TRANSISTORS WITHOUT EPITAXY AND WITH FULLY IMPLANTED BASE AND COLLECTOR REGIONS WHICH ARE SELF-POSITIONING RELATIVE TO EACH OTHER

BACKGROUND OF THE INVENTION

A brief summary of the numerous possibilities for manufacturing bipolar transistors is contained in the magazine article "Advances in Bipolar VLSI" by George R. Wilson in the Proceedings of the IEEE, Volume 78, No. 11, 1990, pages 1707–1719.

The original p-n-insulated bipolar technology is based on the oxidation of the Silicon surface, the single p-n-insulation of an epitaxial layer and the diffusion of doping substances from gaseous sources.

In spite of many technological advances, this manufacturing technology was used for a very long time and to some extent is still in use today.

Modern bipolar technologies today use new technological steps some of which have been developed for MOS technologies. Some examples are: Ion implantation, plasma etching, local oxidation of Silicon (LOCOS) and the use of polycrystalline Silicon.

Since epitaxial processes are expensive, attempts are made to replace this technological part step by other suitable methods. The solution is production of the collector region (buried collector) by means of ion implantation with high accelerating energy. Such a bipolar process constitutes the latest state of the art and will therefore be described briefly as follows:

In a first process step, the N-wells which are later to contain the transistor structures, are produced in a p-doped semiconductor substrate. In order to achieve good transistor parameters, the doping (number of foreign atoms per cubic centimeter) must be greater in the depth of the N-well than at the semiconductor surface, so that it is necessary to work with very high implanting energy. Several implanting steps must be carried out in order to obtain the desired doping profile. For example, in the first step implantation with Phosphorus ions is carried out to produce a highly doped buried layer (sub-collector) with a maximum doping concentration of $10^{18}$ cm-3 at a depth of approx. 4 µm. Then follow two further implantations in the energy range between 0.6 MeV and 1.8 MeV, producing between the semiconductor surface and the sub-collector a relatively homogeneous doping concentration of $10^{16}$ cm$^{-3}$. The three aforementioned implantations are introduced through a single structured masking layer which must be sufficiently thick to really shield off the high energy ions (e.g. 5 µm thick Aluminum). Thereafter the implantation mask is removed and the process steps as known from conventional bipolar or BiCMOS processes are carried out.

In the case of a BiCMOS process one would thereafter define the active regions with the LOCOS process (local oxidation) using a further mask. After this, again using a mask, a base layer is implanted by a p-doping of medium concentration. Two further masking processes introduce a $p^+$-doping for the base contact and a $n^+$-doping for the emitter.

After depositing an intermediate insulator, contact windows are etched free and a metalization is deposited for establishing the electrical connections for emitter, base and collector.

In spite of the utilization of ion implantation, the effort required for this bipolar process is still very great, because many masking steps are necessary and these steps must be mutually adjusted very accurately. The list of minimum required processing stages (the $p^+$-implantation for the base contact can possibly be omitted under certain circumstances) contains at least the following six masking steps:

1) Implantation of the N-Wells
2) Implantation of the base
3) Implantation of the emitter
4) Opening of the contact holes
5) Metalization
6) Passivising A particular disadvantage of the aforementioned processes which must be pointed out is that the individual masking levels entail certain mutual adjustment tolerances. As a consequence of these adjustment tolerances, there will be corresponding fluctuations of the transistor parameters on a given silicon wafer as well as between different wafers. The adjustment tolerances also lead to more surface area on the wafer occupied by each transistor because the adjustment tolerances must be taken into account in the construction of the transistors and corresponding compensation areas must be provided. The compensation areas introduce enlarged parasitic elements which have a negative effect on the performance of the circuit.

SUMMARY OF THE INVENTION

Objects of the present invention include reducing the silicon wafer area occupied by each transistor, to make the parasitic elements smaller and to reduce the number of masks required in the course of the manufacturing process.

The manufacturing process described below is suitable not only for the manufacture of bipolar transistors. Although the following implementation examples are confined to bipolar structures, for example MOS structures could be manufactured in the same manner.

An advantage achieved with the invention is that the vernier positioning of at least two regions of a bipolar transistor is determined with a single mask instead of requiring several masks. Via the mask for positioning the base connection area or the outer base, also at least the vernier position of the collector region, in a good design also the inner base and the emitter as well as the contact region, is/are defined too.

BRIEF DESCRIPTION OF THE DRAWINGS

FIG. 3: (*a*) to (*e*) various stages during the manufacture of the bipolar transistor shown in the previous two drawings;

FIG. 7: (*a*) to (*e*) various stages during the manufacture of the bipolar transistor shown in FIG. 6 (second embodiment);

Figure 1:
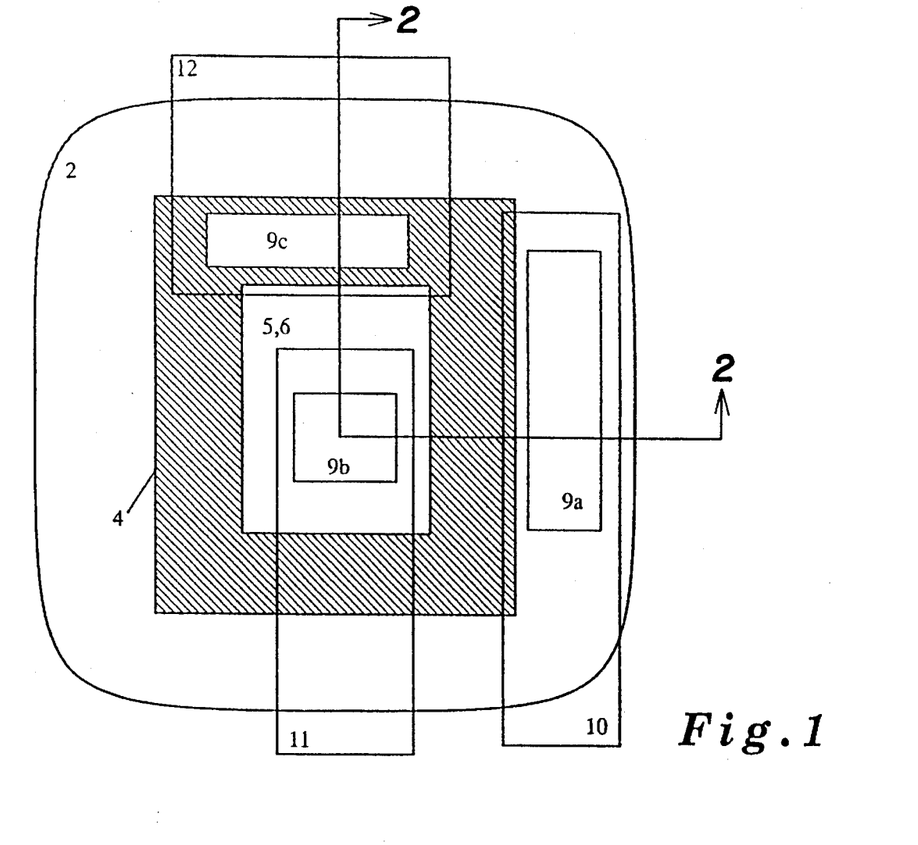
FIG. 1: Top view, of a bipolar transistor manufactured by the process according to the invention (first embodiment)
Figure 2:
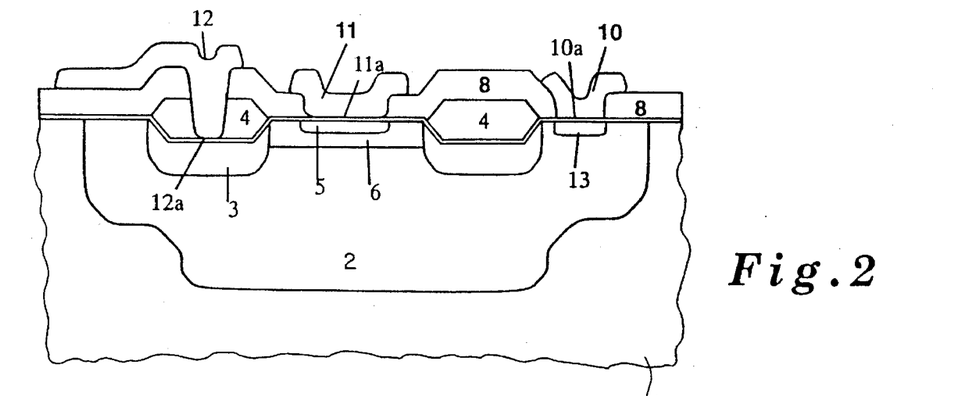
FIG. 2: Cross section of this transistor at the line 2—2 shown in FIG. 1.

The bipolar transistor shown in FIG. 1 and FIG. 2 consists of a semiconductor base substrate 1 of monocrystalline Silicon material which has a weak p-doping ($N_A=10^{15}$ $cm^{-3}$). In this basic semiconductor substrate 1 is located an N-well 2 which has n-type doping with a high doping concentration ($N_{DU} \geq 10^{18}$ $cm^{-3}$) in the lower part and a low doping concentration ($N_{DO} \cong 10^{16}$ $cm^{-3}$, retrograde well) in the upper part. The N-well 2 constitutes the collector of the bipolar transistor.

An annular base connecting region 3 is provided within the N-well 2. This region is $p^+$-doped and buried under an oxide layer 4.

The emitter 5 and the base 6 located thereunder, are located inside the ring of the base connecting region 3.

The emitter 5 has $n^+$-doping ($N_{DE} \cong 10^{20}$ $cm^{-3}$) and the base 6 has p-doping ($N_{AB} \cong 10^{17}$ $cm^{-3}$). The base contact 12a is located within the base connecting region 3.

On the surface of the semiconductor base substrate and over the said structures lies an insulating layer 8 which insulates the individual semiconductor regions from the metalization above. The insulating layer 8 is approx. 800 nm thick and is interrupted by contact windows 9a,b,c only at the places where the connections to the component are made. The connections between the components on a chip are established via the metalization (Aluminum). The collector connection 10, the emitter connection 11 and the base connection 12 are shown in FIG. 1 and FIG. 2.

An $n^+$-layer 13 with doping corresponding to that of the emitter 5 is provided at the edge of the N-well 2 for contacting the collector.

Figure 3A:
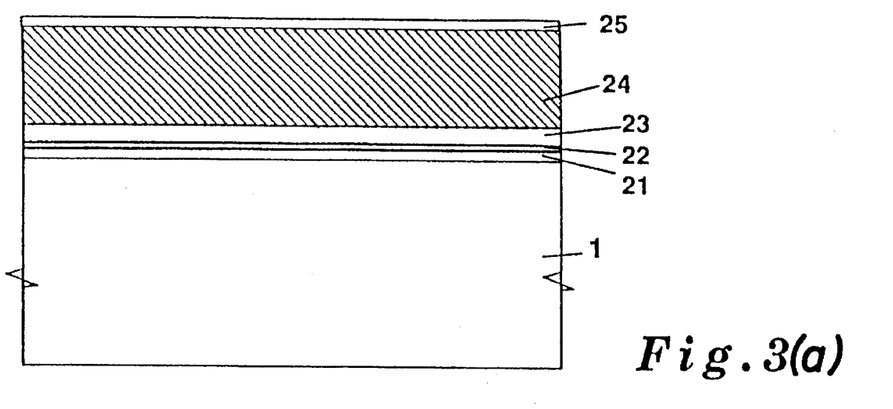

For manufacturing the bipolar transistor, first of all a semiconductor basic substrate 1 with weak p-doping is provided. On this is deposited a layer sequence with an oxidation protection system consisting of a $Si_3N_4$ layer 21 (30 nm), a poly-silicon layer 22 (30 nm) and a shielding layer system consisting of a $SiO_2$ layer 23 (750 nm), an Aluminum layer 24 (4.5 μm) and a WTi layer 25 (200 nm) (FIG. 3a).

Figure 3B:
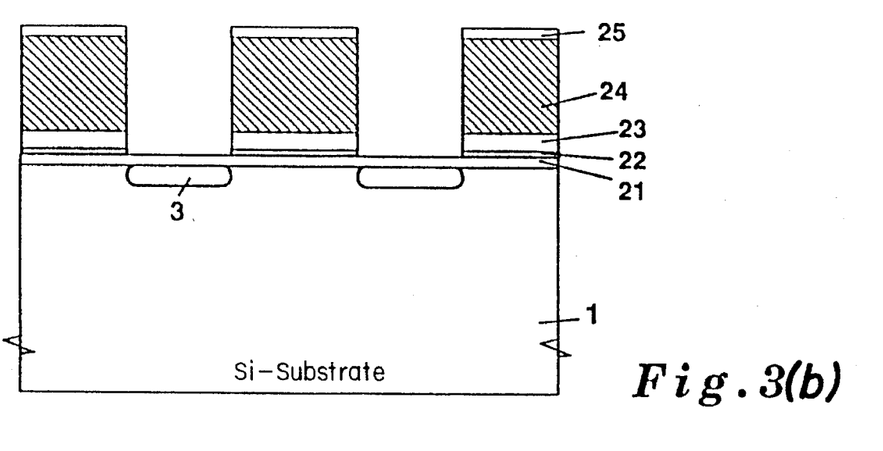

In a first masking step with the known photolithographic procedure, an annular region is etched out of the layer sequence WTi, Aluminum, $SiO_2$, poly-silicon down to the $Si_3N_4$ layer 21 (plasma etching process) (FIG. 3b).

Figure 3C:
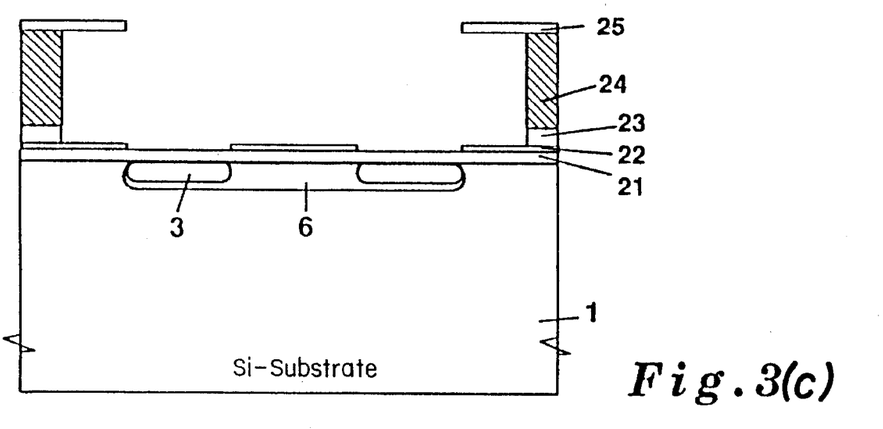
Figure 3D:
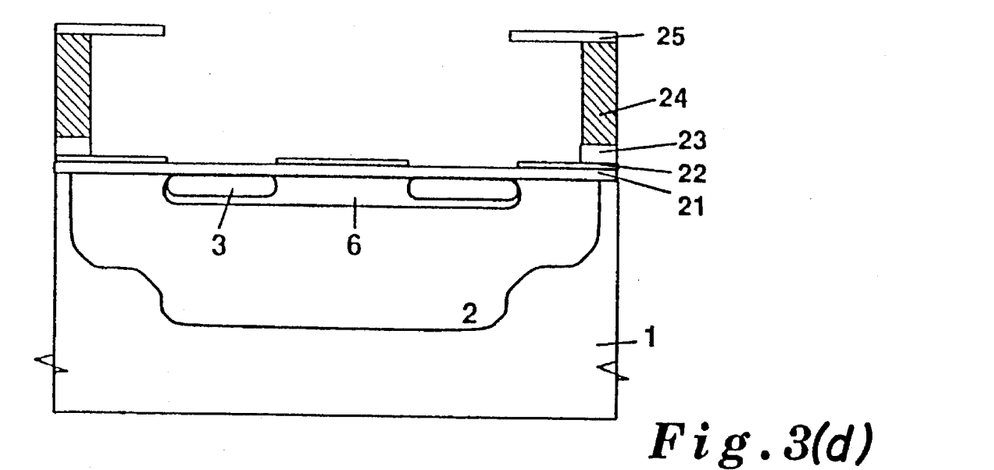

Thereafter (FIG. 3c) follows an implantation of Boron, through the etched-free regions and through the remaining $Si_3N_4$ layer 21, for the base connecting region 3 which is to be formed. Then an under-etching of the $SiO_2$ layer 23 and the Aluminum layer 24 is carried out by a wet etching process, whereby the insular confined inner structures of Aluminum and WTi are etched away completely and removed. It is thereby advisable to hold the silicon wafer with its surface facing downwards during the etching process. During layouting it must be observed that the inner structures of the transistor construction must be designed with only a narrow width (a few μm) in order to make sure that these structures can be completely under-etched. Boron is now implanted in the now enlarged and no longer annular opening in the shielding layer system. This produces the base 6. Thereafter (FIG. 3d) an N-well 2 is shot in by means of high energy implantation of Phosphorus. The sub-collector in the peripheral region of this well has a smaller depth due to the braking effect of the remaining WTi layer 25. For optimum well design it is advisable to carry out the Phosphorus implantation in several stages with different implantation energies of, for example, 0.7 MeV, 1.5 MeV and 6 MeV. During the high energy implantation during the step of forming the sub-collector, the semiconductor substrate (wafer) is moved in a tilting motion or a combined turning and tilting motion in order to control the doping profile in the collector and sub-collector regions.

In the next step (FIG. 3e) The Aluminum layer and the WTi layer are removed completely (wet etching processes) so that only the already structured poly-silicon layer 22, the $Si_3N_4$ layer 21 and the $SiO_2$ layer 23 remain on the Silicon surface. Thereafter the structured poly-silicon layer 22 is oxidized, and with the resulting poly-oxide layer as mask, the $Si_3N_4$ layer 21 is structured (wet etching process).

Figure 3E:
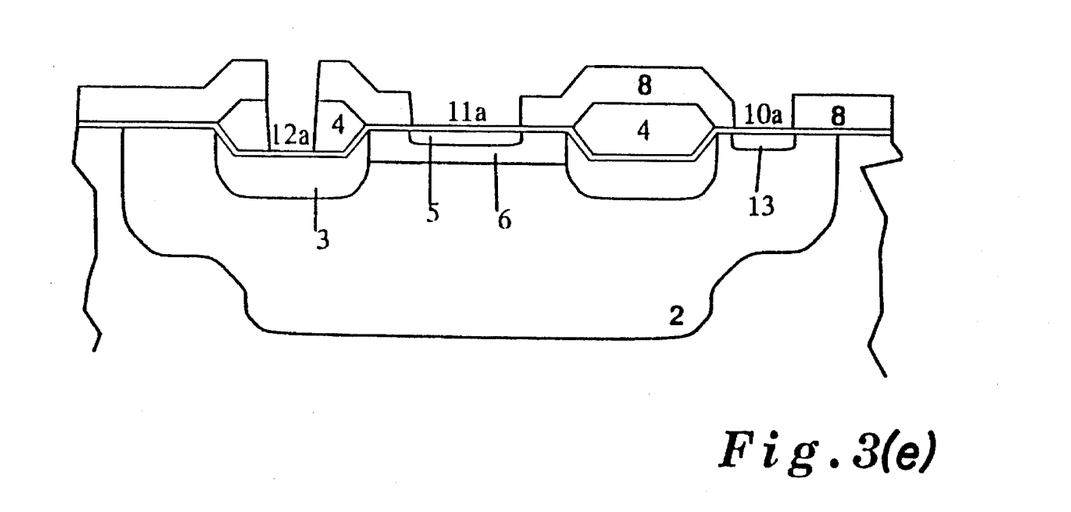
Figure 4:
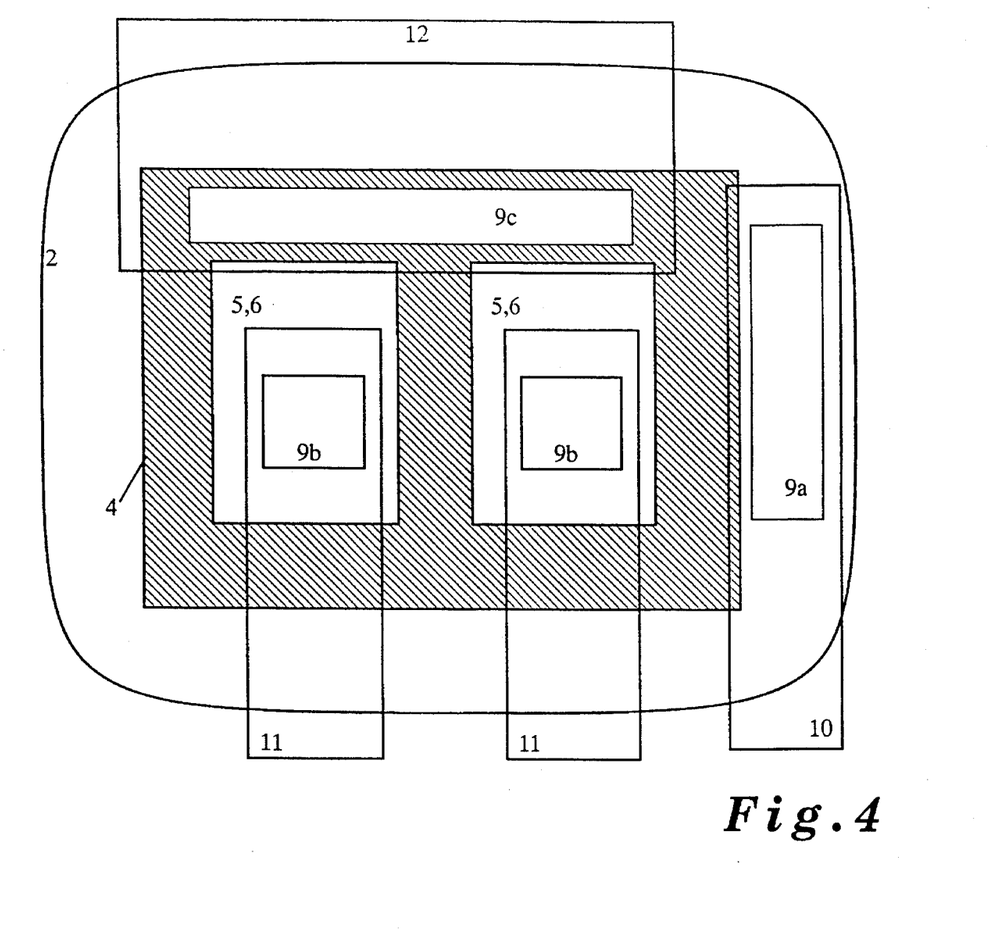
FIG. 4: Top view of a bipolar transistor with two emitters (first embodiment)

After removing the poly-oxide (brief wet etching process in which the $SiO_2$ layer 23 is not removed), a thermal oxidation is carried out whereby the now structured $Si_3N_4$ layer 21 functions as local oxidation protection layer (LOCOS process).

A locally restricted oxide layer 4 is produced which is positioned exactly over the base connecting regions 3. Thereafter a CVD procedure is used to deposit a further oxide layer 8 which has a thickness of approx. 0.6 μm. After opening the contact windows 10a and 11a and etching the contact window 12a down to the oxide layer 4, implantation of the emitter 5 and the $n^+$-layer 13 for the collector contact follows in a single process step. The position of these $n^+$-regions is thereby determined by the location of the contact windows, whereby no doping of the base contact takes place because this oxide layer 4 with a thickness of approx. 400 nm cannot be penetrated by the doping ions.

After implanting the regions 5 and 13, a selective etching process which does not perceptibly attack Silicon in the windows 10a and 11a, is employed to etch the contact window 12a through the oxide layer 4 and, after removing the lacquer mask, a metal layer is deposited and structured. This produces the outer connections of the bipolar transistor consisting of the collector connection 10, the emitter connection 11 and the base connection 12 (FIG. 2).

The advantageous characteristics of the structure arise through the fact that only three photolithographic masks have to be used in the described bipolar transistor manufacturing process (for the base connection region, for the contacts and for the conducting track). The manufacturing processes for the N-well 2 and for the base 6 take place with self-adjustment with respect to the region 3 and the implantation of the $n^+$-regions with respect to the collector windows 10a and 11a. These self-adjusting processes keep the parasitic elements of the transistor small, especially the base resistance, the collector to substrate capacitance and the emitter to base capacitance.

A further advantage is the cost reduction through avoiding several photolithographic processes because no extra masking steps need to be provided for producing the collector, base and emitter.

In the implementation of the invention it is possible by suitable design to produce, by partial under-etching of the shielding layer system in peripheral regions and resulting smaller depth of the sub-collector region in the vicinity of the collector contact, a low resistance collector connection without additional lithographic masks and implantation windows.

Figure 5:
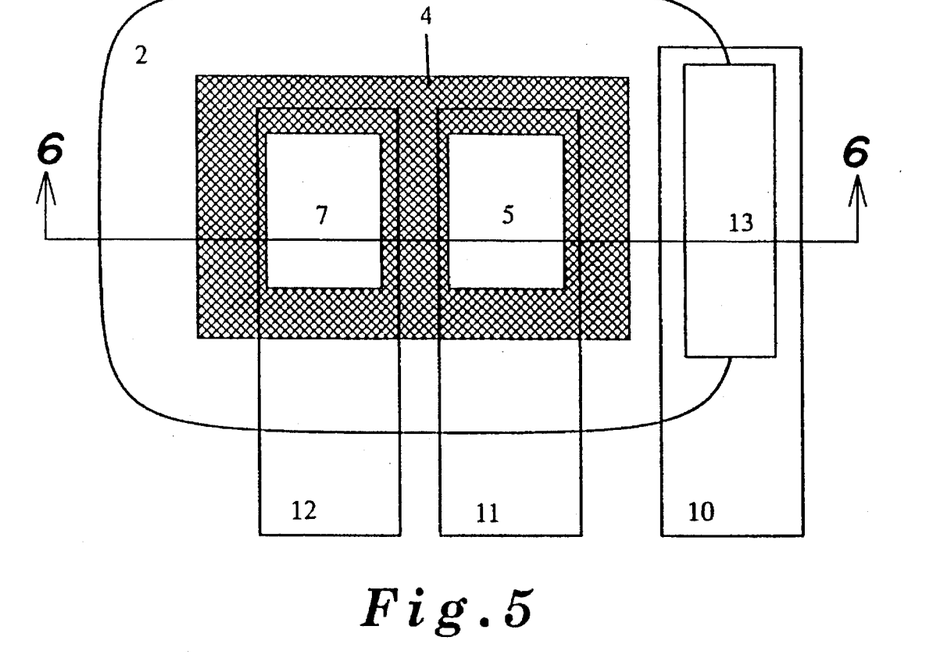
FIG. 5: Top view of a bipolar transistor manufactured by the process according to the invention (second embodiment)
Figure 6:
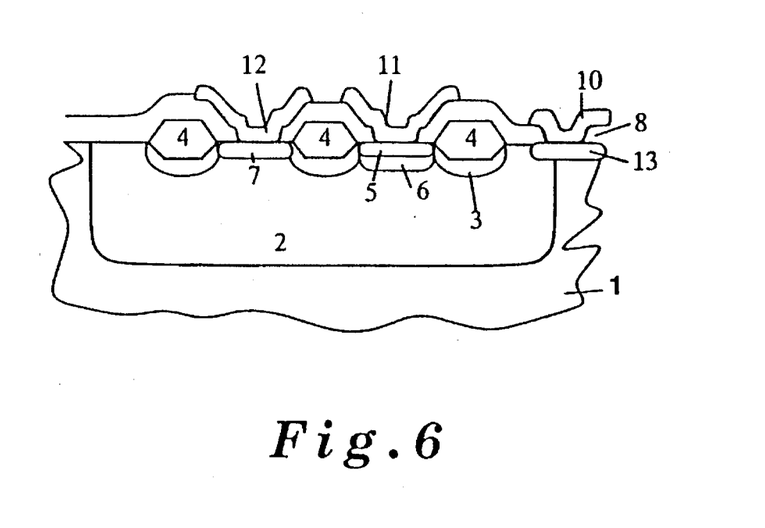
FIG. 6: Cross section of this transistor at the line 2—2 shown in FIG. 5 (second embodiment)

The bipolar transistor of the second embodiment shown in FIG. 5 and FIG. 6 consists of a semiconductor basic substrate 1 of monocrystalline Silicon material which has a weak p-doping ($N_A=10^{15}$ cm$^{-3}$). In this basic semiconductor substrate 1 is located an N-well 2 which has n-type doping with high doping concentration ($N_{DU} \geq 10^{18}$ cm$^{-3}$) in the lower part and a low doping concentration ($N_{DO} \cong 10^{16}$ cm$^{-3}$, retrograde well) in the upper part. The N-well 2 constitutes the collector of the bipolar transistor.

A dual annular base connecting region 3 is provided within the N-well 2. This region is p$^+$-doped and buried under an oxide layer 4.

The emitter 5 and the base 6 below the latter are located inside one of the rings of the base connecting region 3.

The emitter 5 has n$^+$-doping ($N_{DE} \geq 10^{19}$ cm$^{-3}$) and the base has p-doping ($N_{AB} \cong 10^{17}$ cm$^{-3}$).

Inside the other ring of the base connecting region 3 lies the base connection 7 which has a p-doping ($N_{ABA}=10^{17} \ldots 10^{19}$ cm$^{-3}$).

On the surface of the basic semiconductor substrate 1 and over the described structures lies an insulating layer 8 which serves as insulation of the individual semiconductor regions with respect to the metalization above. The insulating layer 8 is approx. 0.8 µm thick and is interrupted only at the places for the contact windows 9 a,b,c at which the connections to the component are to be made. The connections between the components on a chip are established with the metalization (Aluminum). FIG. 5 and FIG. 6 show the collector connection 10, the emitter connection 11 and the base connection 12. An n$^+$-layer 13 is provided at the edge of the N-well 2 for contacting the collector. The doping of this layer corresponds to that of the emitter 5.

Figure 7A:
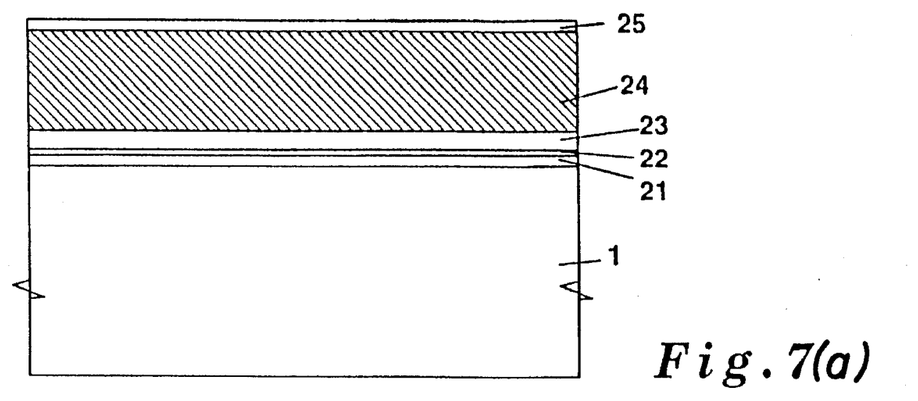

For manufacturing the bipolar transistor, first of all a basic semiconductor substrate 1 with weak p-doping is provided. On this is deposited a sequence of layers with an oxidation protection layer system consisting of an Si$_3$N$_4$ layer 21 (30 nm), a poly-silicon layer 22 (30 nm) and a shielding layer system consisting of a SiO$_2$ Layer 23 (750 nm), an Aluminum layer 24 (4.5 µm) and a WTi layer 25 (200 nm) (FIG. 7a).

Figure 7B:
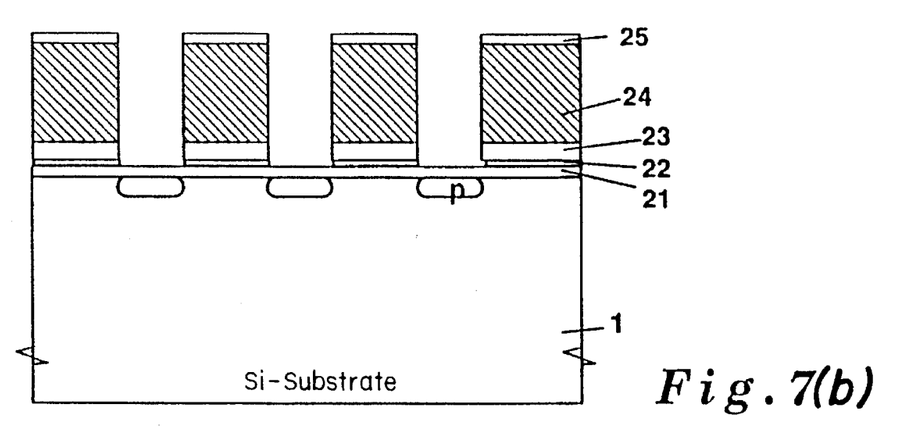

In a first masking step employing known photolithographic processes, a dual annular region is etched out of the layer sequence WTi, Aluminum, poly-silicon down to the Si$_3$N$_4$ layer 21 (plasma etching process, FIG. 7b).

Figure 7C:
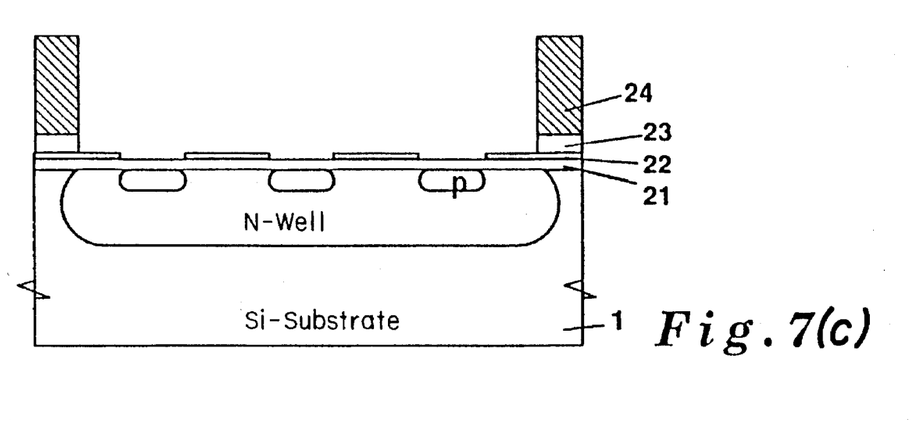

Thereafter follows, in the etched-free regions, the implantation of Boron penetrating through the remaining Si$_3$N$_4$ layer 21, for the base connecting region 3 which is to be formed. By subsequent under-etching of the Aluminum layer 24 in wet etching processes, the outer edge of the Aluminum layer 24 is displaced outwards and the inner structures are etched away completely (FIG. 7c). It must be pointed out that only narrow widths (a few µm) are permitted in the design of the transistor construction, in order to make sure that these structures can be under-etched completely. Then follows an SiO$_2$ and WTi etching step. Through the resulting enlarged freed region an N-well 2 is shot-in (FIG. 7c) by means of high energy implantation of Phosphorus. For optimum design of the well it is advisable to carry out the Phosphorus implantation in several stages with different implantation energies of, for example, 1 MeV, 2 MeV and 6 MeV.

In the next step (FIG. 7d) the Aluminum shielding system is removed completely (wet etching process), so that only the already structured poly-silicon layer 22 and the Si$_3$N$_4$ layer 21 remain on the Silicon surface. Thereafter the structured poly-silicon layer 22 is oxidised and the Si$_3$N$_4$ layer 21 is then structured using the resulting poly-oxide layer as a mask (wet etching process).

Figure 7D:
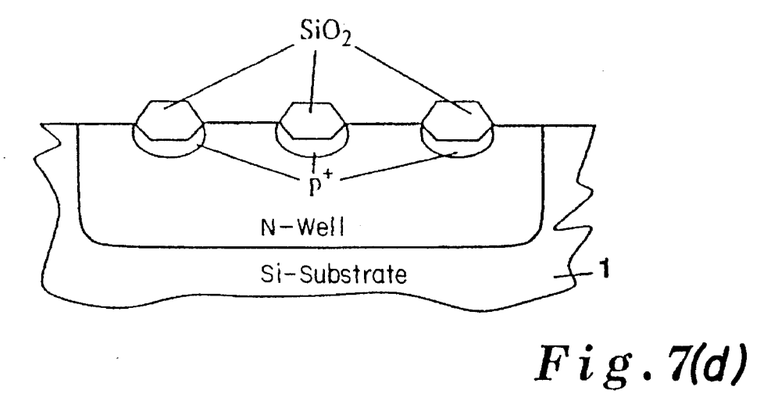

After removing the poly-oxide (wet etching process), a thermal oxidation is carried out whereby the now structured Si$_3$N$_4$ layer 21 functions as local oxidation protection layer (LOCOS process) (FIG. 7d). Oxide layers 4 are produced which are positioned exactly over the base connecting regions 3.

Figure 7E:
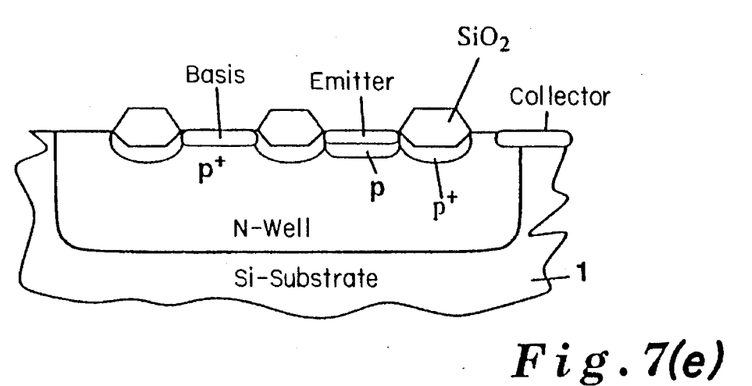

Via two photolithographic processes then follow implantation of the base 6 and base connection 7 as well as the emitter 5 and the n$^+$-layer 13 for the collector contact.

The position of the emitter 5, the base 6 and the base connection 7 is thereby determined on the one hand by the lacquer masks and on the other hand by the location of the oxide layers 4, because these oxide layers 4 have a thickness of approx. 400 nm which cannot be penetrated by the doping ions. Thus the position of the emitter 5 is self-adjusting with respect to the surrounding base connecting region 3 (FIG. 7e).

The structures are then covered with an insulating layer 8 (thickness approx. 0.8 µm). For contacting, contact windows 9 a,b,c are etched in the insulating layer 8 with the aid of photolithographic processes and thereafter a metal layer is deposited and structured. This produces the external connections of the bipolar transistor consisting of the collector connection 10, the emitter connection 11 and the base connection 12 (FIG. 6).

The advantageous characteristics of the structure result from the fact that only one photolithographic mask is used for the critical dimensions of the bipolar transistor, namely the first mask for the base connecting region 3 in the manufacturing process described above. The subsequent manufacturing processes for the N-well 2, for the base 6 and for the emitter 5 are self-adjusting with respect to the oxide layer 4 and thus with respect to the base connecting region 3. Through these self-adjusting processes the parasitic elements of the transistor are kept small, especially the base resistance and the collector to substrate capacitance.

A further advantage is the elimination of at least one photolithographic process, because no extra mask need be provided for forming the collector.

In the implementation of the invention the manufacturing process described above is modified such that an isotropic (wet chemical) SiO$_2$ etching step follows as in the first implementation example after the first masking step with etching-out of a dual annular region in the layer sequence and after the implantation procedure for the base connecting region 3 to be formed. This strongly under-etches the Aluminum layer 24, and the insular inner structures of the shielding layer system are removed. Thereafter the base implantation is introduced into the now freed region without requiring a masking process.

Figure 8:
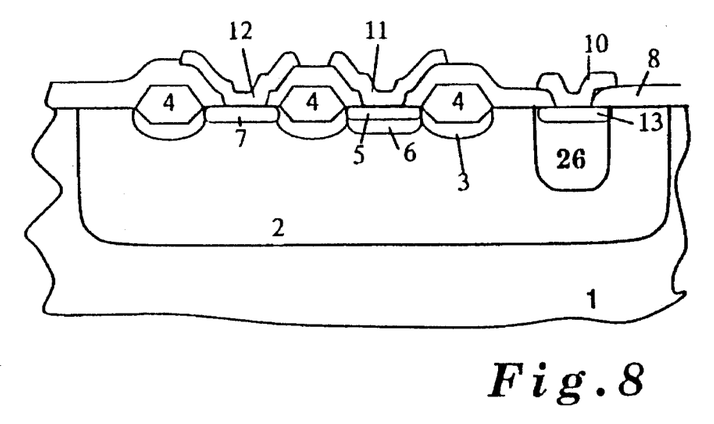
FIG. 8: A cross section of a bipolar transistor with low resistance connected sub-collector by means of shaft implantation (second embodiment)

For some transistor applications it is necessary to establish a very low resistance connection between the collector connection 10 and the sub-collector. This can be achieved on the one hand with an annular n$^+$-layer 13 surrounding the N-well 2. If this is insufficient, a deep implantation with high Phosphorus doping is provided at the edge of the N-well 2. For this purpose an additional masking process is provided before the first masking process specified above. The additional masking process produces a strip-form opening in the shielding layer system beside the dual annular region produced later. Phosphorus is shot-in with high energy through this opening so that a highly doped region, the n$^+$-shaft 26, is produced for the low resistance connection. The cross section of such a transistor with n$^+$-shaft 26 is shown in FIG. 8.

Figure 9:
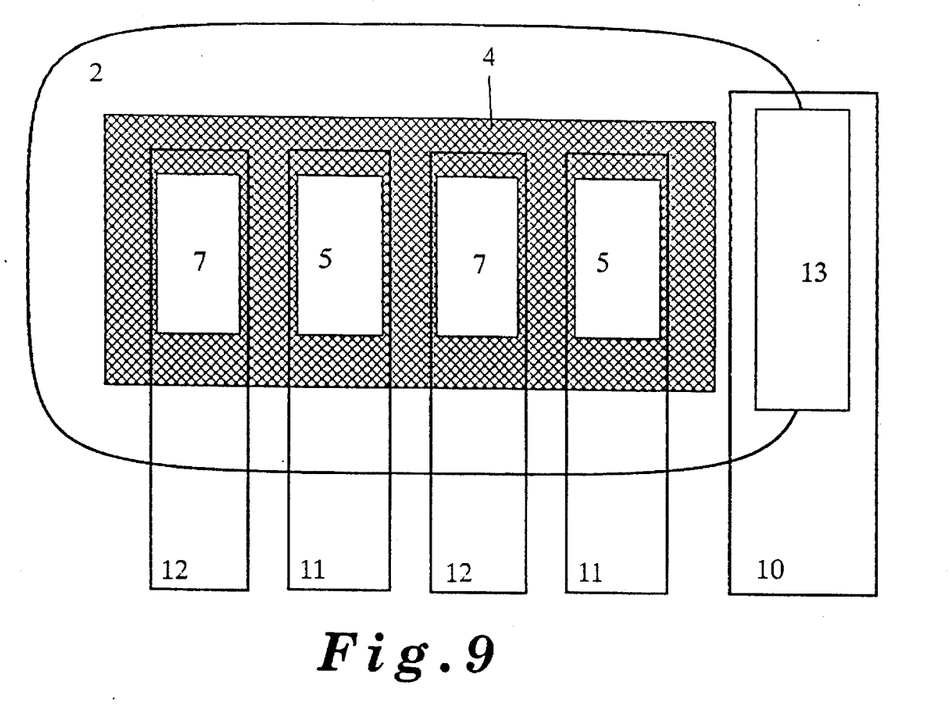
FIG. 9: Top view of a bipolar transistor with several emitter and base connections (second embodiment).

As already mentioned above, there are restrictions imposed on the construction with regard to the dimensions of the inner structures of the transistor, i.e. depending on the particular technology, the width of the emitter 5 and of the base connection 7 must be smaller that 4 μm to 10 μm. In order to obtain transistors with higher current ratings, either the emitter region is made very long or several emitters are provided (FIG. 9). It is thereby possible to produce one base connection 7 and several emitters 5 or, for very small base resistances, to position base connections 7 and emitters 5 alternately. FIG. 9 shows the version with alternating base connections 7 and emitters 5. To obtain a low base resistance it is also possible to devise a single strip emitter 5 with base connections 7 positioned to the left and right thereof.

We claim:

1. A method of fabricating a semiconductor device comprising the steps of:
   (a) depositing, on a semiconductor substrate of a first conductivity type, a series of layers to form a shielding arrangement including an upper part and a lower part to provide a shield against accelerated ions;
   (b) forming openings in said shielding arrangement by microlithographic processes and anisotropic etching;
   (c) implanting ions via said openings to form one of a base area and a base-connection area of said first conductivity type;
   (d) displacing edges of said openings by isotropic etching of said lower part of said shielding arrangement;
   (e) implanting ions accelerated to energies sufficient to penetrate said one of said base area and base-connection area and a portion of said substrate underlying said one of said base area and base-connection area to form a sub-collector and a graded collector of a second conductivity type for completely encircling and separating a base from said substrate, wherein said sub-collector is more heavily doped than said collector;
   (f) forming said base by one of:
   implanting ions between said step (b) of forming openings and said step (e) of implanting ions accelerated, and
   implanting ions after said step (e) of implanting ions accelerated;
   (g) forming an emitter;
   (h) depositing an insulating layer;
   (i) forming contacts to said base, said emitter and said collector; and
   (j) forming a metalization arrangement.

2. The method of claim 1, further comprising the step of depositing an oxidation protection arrangement, including silicon nitride, on said semiconductor substrate prior to said step of depositing said series of layers to form said shielding arrangement, at least a portion of said oxidation protection arrangement being structured together with said upper part of said shielding arrangement before said lower part of said shielding arrangement is etched isotropically.

3. The method of claim 2, wherein:
   said step of forming openings in said shielding arrangement forms an annular area for said semiconductor device including at least one insular inner structure having a lateral dimension in one direction that is smaller than twice a depth resulting from said isotropic etching, whereby said insular inner structure disappears because of under-etching resulting therefrom, and
   further comprising the steps of:
   after formation of at least one of said collector and sub-collector, carrying out a local oxidation for producing an oxide layer above said base-connection area; and
   after said insular inner structure disappears, carrying out doping of said first conductivity type by a step of ion implantation through said opening to form said base.

4. The method of claim 3, wherein the step of ion implantation to form said base is carried out by using said oxide layer above said base-connection area as a masking layer.

5. The method of claim 3, wherein during said step of carrying out a local oxidation for producing an oxide layer above said base-connection area, regions of contact with said base which is yet to be formed are oxidized, and a contact area for said regions of contact with said base is etched through said oxide layer formed above said base-connection area.

6. The method of claim 5, wherein said semiconductor device being fabricated is a bipolar transistor, and the steps of forming said base-connection area, said base, said collector, said emitter, said contact to said emitter and said contact to said collector are carried out in a mutually self-positioning manner, and with only one lithographic process to define said base-connection area.

7. The method of claim 3, wherein said oxidation protection arrangement includes a layer sequence of a $Si_3N_4$ layer and a polycrystalline silicon layer.

8. The method of claim 7, wherein before said local oxidation is carried out, a remaining amount of said polycrystalline silicon layer is oxidized to form an oxide which is used as a masking layer to structure the $Si_3N_4$ layer by etching.

9. The method of claim 1, wherein said contact to said collector is placed in a peripheral region of said collector utilizing a surface doping in said peripheral region, wherein said surface doping has a dopant concentration that is higher than the dopant concentration of said collector.

10. The method of claim 9, wherein at least a portion of said shielding arrangement is etch-resistant in said step of displacing edges, so that when at least one of said sub-collector and said collector is implanted, said implanting ions are refracted by said portion of said shielding arrangement that is etch-resistant, so that in said peripheral region of said collector, a doping of a vertical collector profile is adjacent a surface of said semiconductor device.

11. The method of claim 9, wherein said lower part of said shielding arrangement includes a plurality of layers, one layer of which has an etching rate during said isotropic etching which is slower compared with an etching rate of an adjacent layer so that, due to the difference in said etching rates, said layer with said slower etching rate takes on a wedge form after at least one isotropically acting etching process and, after implantation of said sub-collector, said sub-collector has a continuously reducing penetration depth in a region of said wedge.

12. The method of claim 9, wherein during said step of implanting ions to form at least one of said sub-collector and collector, said semiconductor substrate is moved in one of a tilting motion and a combined turning and tilting motion.

13. The method of claim 11, further comprising the steps of making a separate opening in said shielding arrangement before structuring said base-connection area by a masking step and an etching step in an area of said contact to said collector which is yet to be formed, and implanting an $n^+$-doped layer through said separate opening, the distance of the separate opening to said base-connection area being smaller than twice a depth produced by under-etching with said isotropic etching.

14. The method of claim 1, further comprising the following steps after formation of at least one said base and base-connection area:

depositing an insulating layer suitable for masking emitter implantation on at least one of said base and said base-connection area, thereafter forming windows for said emitter, said contact to said collector and said contact to said base, thereafter depositing a p-conducting polysilicon layer and structuring said p-conducting polysilicon layer with a lacquer mask which is preserved to act as a shielding layer for subsequent implantation of said emitter and a collector connection, to be carried out without using an additional mask, to protect against compensation by said emitter implantation the p-conducting polysilicon layer which covers said contact to said base or constituted as polysilicon resistors.

15. The method of claim 14, wherein said step of forming windows is carried out by one of (a) local oxidation using an oxidation protection layer arrangement, and (b) an etching mask followed by an insulator etching step.

16. The method of claim 1, wherein the shielding arrangement includes a layer sequence of $SiO_2$, aluminum and WTi.

17. The method of claim 1, further comprising the steps of arranging two said bases and said base-connection area so that all are adjacent to each other to form a lateral bipolar transistor, with said collector and sub-collector forming a lateral base, and said lateral base and base-connection area forming a lateral emitter and collector.

18. The method of claim 1, wherein the lower part of said shielding arrangement includes a plurality of layers, and said step of displacing edges is carried out by isotropic etching of at least one of said plurality of layers.

* * * * *